(12) United States Patent
Fukami

(10) Patent No.: US 6,884,721 B2
(45) Date of Patent: *Apr. 26, 2005

(54) SILICON WAFER STORAGE WATER AND SILICON WAFER STORAGE METHOD

(75) Inventor: Teruaki Fukami, Fukushima-ken (JP)

(73) Assignee: Shin-Etsu Handotai Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 67 days.

(21) Appl. No.: 09/218,997

(22) Filed: Dec. 22, 1998

(65) Prior Publication Data

US 2002/0051731 A1 May 2, 2002

(30) Foreign Application Priority Data

Dec. 25, 1997 (JP) .............................................. 9-367049
Dec. 26, 1997 (JP) .............................................. 9-369584
Jul. 29, 1998 (JP) ............................................ 10-228675

(51) Int. Cl.⁷ ............................ H01L 21/30; C23G 1/24
(52) U.S. Cl. ............................ 438/690; 438/692; 134/2
(58) Field of Search ............................ 134/2; 204/131; 438/692, 800, 690; 516/113, 198; 252/156; 437/225

(56) References Cited

U.S. PATENT DOCUMENTS

| | | | | | |
|---|---|---|---|---|---|
| 4,944,119 A | * | 7/1990 | Gill, Jr. et al. | ................ | 51/215 |
| 4,973,563 A | * | 11/1990 | Prigge et al. | ................ | 437/225 |
| 5,290,361 A | * | 3/1994 | Hayashida et al. | ............ | 134/2 |
| 5,399,247 A | * | 3/1995 | Carey et al. | ................ | 204/131 |
| 5,466,389 A | * | 11/1995 | Ilardi et al. | ................. | 252/156 |
| 5,484,748 A | * | 1/1996 | Suzuki et al. | ................... | 134/2 |
| 5,518,624 A | * | 5/1996 | Filson et al. | ................ | 210/651 |
| 5,651,836 A | * | 7/1997 | Suzuki | ........................ | 134/34 |
| 5,958,794 A | * | 9/1999 | Bruxvoort et al. | .......... | 438/692 |

FOREIGN PATENT DOCUMENTS

| | | | |
|---|---|---|---|
| EP | 0 702 399 | * | 3/1993 |
| EP | 0 665 582 | * | 8/1995 |
| EP | 0 674 343 | * | 9/1995 |
| EP | 0 702 399 |   | 3/1996 |
| JP | 04083585 A | * | 3/1992 |
| JP | 4-101418 | * | 4/1992 |
| JP | 4-130100 | * | 5/1992 |

OTHER PUBLICATIONS

Kern, W., "Overview and Evolution of Semiconductor Wafer Contamination and Cleaning Technology", in Handbook of Semiconductor Wafer Cleaning Technology, Kern, W. (ed.), Noyes Publication, Parkridge, NJ, 1993.*

Ohmi, T. et al. Abstract of "Metallic impurities segregation at the interface between silicon wafer and liquid during wet cleaning," Journal of the Electrochemical Society, vol. 139 (111), pp. 3317–3335, 1992.*

Shannon, W. J., "A Study of Dielectric Defect Detection by Decoration With Copper," RCA Review. Jun. 1970, pp. 431–438.

(Continued)

*Primary Examiner*—Elizabeth McKane
(74) *Attorney, Agent, or Firm*—Hogan & Hartson LLP

(57) ABSTRACT

Storage water used for storage of a silicon wafer in water is disclosed. The storage water contains Cu at a concentration of 0.01 ppb or less. A method of storing a silicon wafer in water is also disclosed. In the method, water containing Cu at a concentration of 0.01 ppb or less is used. In another method, a wafer is stored in water or a chemical solution, to which a chelating agent is added. The storage water and the storage methods can prevent degradation of oxide dielectric breakdown voltage which would otherwise occur due to Cu contamination from the storage water.

6 Claims, 1 Drawing Sheet

OTHER PUBLICATIONS

Morinaga, et al. "A Model for the Electrochemical Deposition and Removal of Metallic Impurities on Si Surfaces," IEICE Trans. Electron., vol. E79–C. No. 3, Mar. 1996, pp. 343–362.

Ohmi, et al. "Metallic Impurities Segregation at the Interface Between Si Wafer and Liquid during Wet Cleaning," J. Electrochem. Soc., vol. 139 (1992), No. 11, Nov. 1992, pp. 3317–3335.

* cited by examiner

SILICON WAFER STORAGE WATER AND SILICON WAFER STORAGE METHOD

BACKGROUND OF THE INVENTION

1 Field of the Invention

The present invention relates to silicon wafer storage water and a silicon wafer storage method which are used for storing a silicon wafer in water, and particularly to silicon wafer storage water and a silicon wafer storage method which are used for storing a silicon wafer in water immediately after polishing.

2 Description of the Related Art

A process of producing a semiconductor wafer typically comprises the steps of slicing a monocrystalline ingot to obtain a thin disk-shaped wafer; chamfering the outer circumferencial portion of the thus-sliced wafer for prevention of cracking and chipping thereof; lapping the surface of the wafer to attain flatness; etching for eliminating mechanical damage that remains on the chamfered and lapped wafer; polishing the surface of the wafer to attain a mirrored surface; and cleaning the polished wafer to remove the polishing agent and foreign matter adhering thereto.

These are the main steps. In some cases, other steps such as heat treatment are additionally performed, or the sequence of the steps is changed. Further, in some cases, temporary storage of a wafer is required during the waiting period between one step and the next. In such a case, the wafer must be stored according to a method suitable for the condition thereof.

For example, if there is a waiting period between the polishing step and the subsequent cleaning step, a wafer may be stored in water during the waiting period. The reason is that if the wafer is allowed to stand in the air, polishing slurry dries and adheres to the wafer. The adhered slurry is difficult to remove in the subsequent cleaning step.

In such a case where a wafer is stored in storage water, a surfactant is sometimes added to the storage water in order to improve the particle-removing performance of the storage water. In this case, in order to maintain a constant concentration of the surfactant, the wafer is usually stored while being immersed in water contained in a container (hereinafter the water may be called "pit water").

Generally, ultrapure water is used as such water for storing a silicon wafer, so as not to contaminate the wafer.

It is known that if heat treatment is performed on a wafer without removal of impurities, especially heavy metals, adhering thereto, the impurities adversely affect the electrical characteristics of semiconductor devices. For this reason, a cleaning step for removing impurities is usually provided before the heat treatment.

Therefore, detecting and removing contamination of cleaning solution and that of the surface of a silicon wafer after the cleaning step are highly important, and conventionally, techniques for removing such contaminant have been studied.

However, the conventionally studied techniques have been directed toward removing substances which have adhered to a wafer in steps preceding the cleaning step. Specifically, in the conventional techniques, contaminants which have adhered to a wafer in steps preceding the cleaning step are removed through cleaning, or contamination during the cleaning is prevented, to thereby yield a silicon wafer having a clean surface.

However, even when cleaning is performed, while the concentration of contaminant in cleaning solution is controlled, in order to produce a silicon water having a clean surface, a final wafer that has undergone all processing steps sometimes becomes defective in that its oxide dielectric breakdown voltage is degraded.

Degradation of oxide dielectric breakdown voltage is generally known to occur when a wafer is contaminated with a metal and the metal remains on the wafer surface.

The present inventors analyzed metallic impurities remaining on the surface of a silicon wafer after cleaning, and performed an investigation in order to find a correlation between the concentration of impurities and the number of defective wafers suffering degradation of oxide dielectric breakdown voltage. As a result, they found that the concentration of impurities is not a factor that determines whether or not a wafer becomes defective. That is, they found that even in the case of a defective wafer having degraded oxide dielectric breakdown voltage, proper cleaning had been performed and therefore impurities had been removed.

In view of the foregoing, the present inventors analyzed the causes of such degradation of oxide dielectric breakdown voltage, and found that such degradation of oxide dielectric breakdown voltage is caused by a conventional method of storing a silicon wafer in a step before the cleaning step. Especially, in the case where storage water contains ions of metals, such as copper and silver, having an ionization tendency lower than that of silicon, if a silicon wafer immediately after being subjected to polishing and having a hydrophobic surface is stored in the storage water, the quality of an oxide film of the wafer degrades significantly during subsequent thermal oxidation, resulting in occurrence of degradation of oxide dielectric breakdown voltage.

This phenomenon can occur in any silicon wafer having a hydrophobic surface, and does not occur only in a wafer immediately after polishing. For example, an epitaxial wafer—which is produced through growth of an epitaxial layer on a silicon wafer substrate—has been confirmed to have a hydrophobic surface after the epitaxial growth and to suffer the same problem.

Further, the results of investigation revealed that especially in the case where the metal impurity is Cu, degradation of oxide dielectric breakdown voltage occurs even when the concentration of Cu ions in storage water is 1 ppb or less.

Especially, the present inventors found that in the case where the concentration of Cu ions in storage water is higher than 0.01 ppb, if a silicon wafer having a hydrophobic surface is stored in the storage water immediately after polishing, the quality of oxide film degrades significantly during a subsequent thermal oxidization step, resulting in occurrence of degradation of oxide dielectric breakdown voltage.

Various factors, such as contaminant carried over from preceding steps, can cause such contamination of storage water at a low level of Cu ions. For this reason, there has existed demand for a technique for prevention of degradation of oxide dielectric breakdown voltage, which would otherwise occur due to the above-mentioned causes.

SUMMARY OF THE INVENTION

In view of the foregoing, the main object of the present invention is to provide silicon wafer storage water and a silicon wafer storage method which can prevent contamination during storage to thereby prevent degradation of oxide dielectric breakdown voltage.

To achieve the above object, the present invention provides storage water used for storage of a silicon wafer in water, characterized in that the storage water contains Cu at a concentration of 0.01 ppb or less.

If the Cu concentration of the storage water is set to 0.01 ppb or less, there can be prevented the adverse effects of Cu ions on a wafer, as well as degradation of the quality of an oxide film of the wafer which would otherwise occur when the wafer is subjected to thermal oxidation in a subsequent step.

The present invention also provides storage water used for storage of a silicon wafer in water, characterized in that the storage water contains Cu at a concentration of 0.01 ppb or less and a surfactant.

Addition of a surfactant to the storage water improves particle removal performance of the storage water. Further, although a surfactant is added to the storage water, degradation of oxide dielectric breakdown voltage does not occur, because the overall Cu concentration of the storage water is made 0.01 ppb or less.

The present invention also provides a method of storing a silicon wafer in water, characterized by use of storage water containing Cu at a concentration of 0.01 ppb or less.

If a silicon wafer is stored in storage water containing Cu at a concentration of 0.01 ppb or less, there is prevented adhesion of slurry and the like to the wafer which would occur in the case where the silicon wafer is left in the air. In addition, contamination during storage is prevented, so that degradation of oxide dielectric breakdown voltage can be avoided.

The present invention provides another method of storing a silicon wafer in water, characterized by use of storage water containing Cu at a concentration of 0.01 ppb or less and a surfactant.

Use of storage water containing Cu at a concentration of 0.01 ppb or less and a surfactant prevents degradation of oxide dielectric breakdown voltage, and further prevents adhesion of particles or removes particles.

In this case, the wafer is preferably stored in pit water so as to maintain the concentration of the added surfactant at a certain level.

Preferably, in the above-mentioned methods for storing a silicon wafer in water, the silicon wafer has a hydrophobic surface.

The above-mentioned methods for storing a silicon wafer in water are effective regardless of whether the surface of the silicon wafer is hydrophilic or hydrophobic. However, the effect becomes significant when a silicon wafer whose surface has no oxide film and is therefore hydrophobic before being stored in water is stored in the water.

Preferably, in the above-mentioned methods for storing a silicon wafer in water, the silicon wafer is stored in water immediately after polishing.

The above-mentioned methods for storing a silicon wafer in water are especially effective when a silicon wafer immediately after being polished and having a hydrophobic surface is stored in water. That is, the storage method of the present invention can be advantageously used to store a silicon wafer during a waiting period between a polishing step and a subsequent cleaning step in a silicon-wafer production process.

Moreover, the present invention provides a method of storing a silicon wafer in a storage solution, characterized in that the storage solution is mainly formed of water or a chemical solution, to which a chelating agent is added.

As described above, in the method of storing a silicon wafer in a storage solution according to the present invention, a chelating agent is added to water or a chemical solution to prepare the storage solution. Therefore, even when harmful metallic ions, such as Cu ions, are introduced into the storage solution, there is prevented metallic contamination of a wafer and the accompanying degradation of oxide dielectric breakdown voltage. As the water to which a chelating agent is added, there may be used the storage water of the present invention containing Cu at a concentration of 0.01 ppb or less. In this case, more significant effects are obtained.

The above-mentioned method for storing a silicon wafer in a storage solution is effective regardless of whether the surface of a silicon wafer is hydrophilic or hydrophobic. However, the effect becomes significant when a silicon wafer whose surface has no oxide film and is therefore hydrophobic is stored in the storage solution. That is, the storage method of the present invention can be advantageously used to store a silicon wafer during a waiting period between a polishing step and a subsequent cleaning step in a silicon-wafer production process.

In the case where the storage solution is water, a chelating agent is not dissolved well in the water, because of a low solubility of the chelating agent to water. Therefore, when the concentration of metal ions contained in the storage water is high, contamination by the metal ions cannot be suppressed sufficiently by the chelating agent at a concentration, at which the chelating agent can be dissolved in the water. In such a case, an alkaline solution in which the chelating agent exhibits a higher solubility is preferably used as a storage solution, to which the chelating agent is added.

In the case where water or chemical solution which contains a chelating agent especially an alkaline solution, is used as the storage solution, the surface of a wafer may be roughened due to the etching action of the alkaline solution. In this case, a proper amount of a surfactant is preferably added to the storage solution.

Also, as the above-mentioned chelating agent, there may be effectively used a chelating agent having a chelate compound production performance not lower than that of NTA (nitrotriacetic acid).

Other than NTA, examples of the above-mentioned chelating agents include EDTA (ethylenediaminetetraacetic acid), DTPA (diethylenetriamine-N,N,N',N'',N''-pentaacetic acid), CyDTA (diaminocyclohexane-N,N,N',N'-tetraacetic acid), and sodium salts thereof. They provide desirable effects whether they are used singly or in combination of two or more.

As described above, the present invention prevents degradation of oxide dielectric breakdown voltage, which would otherwise occur due to contamination by Cu contained in storage water and which has been a problem in relation to storage of a silicon wafer in water.

Especially, in the case where the present invention is used to store a silicon wafer immediately after being polished and having a hydrophobic surface and during a waiting period until the wafer is fed to a cleaning step, the present invention prevents adhesion of polishing slurry which would otherwise occur when the wafer is left in the air, while preventing degradation of oxide dielectric breakdown voltage of the silicon wafer.

DETAILED DESCRIPTION OF THE INVENTION AND PREFERRED EMBODIMENTS THEREOF

Figure 1:
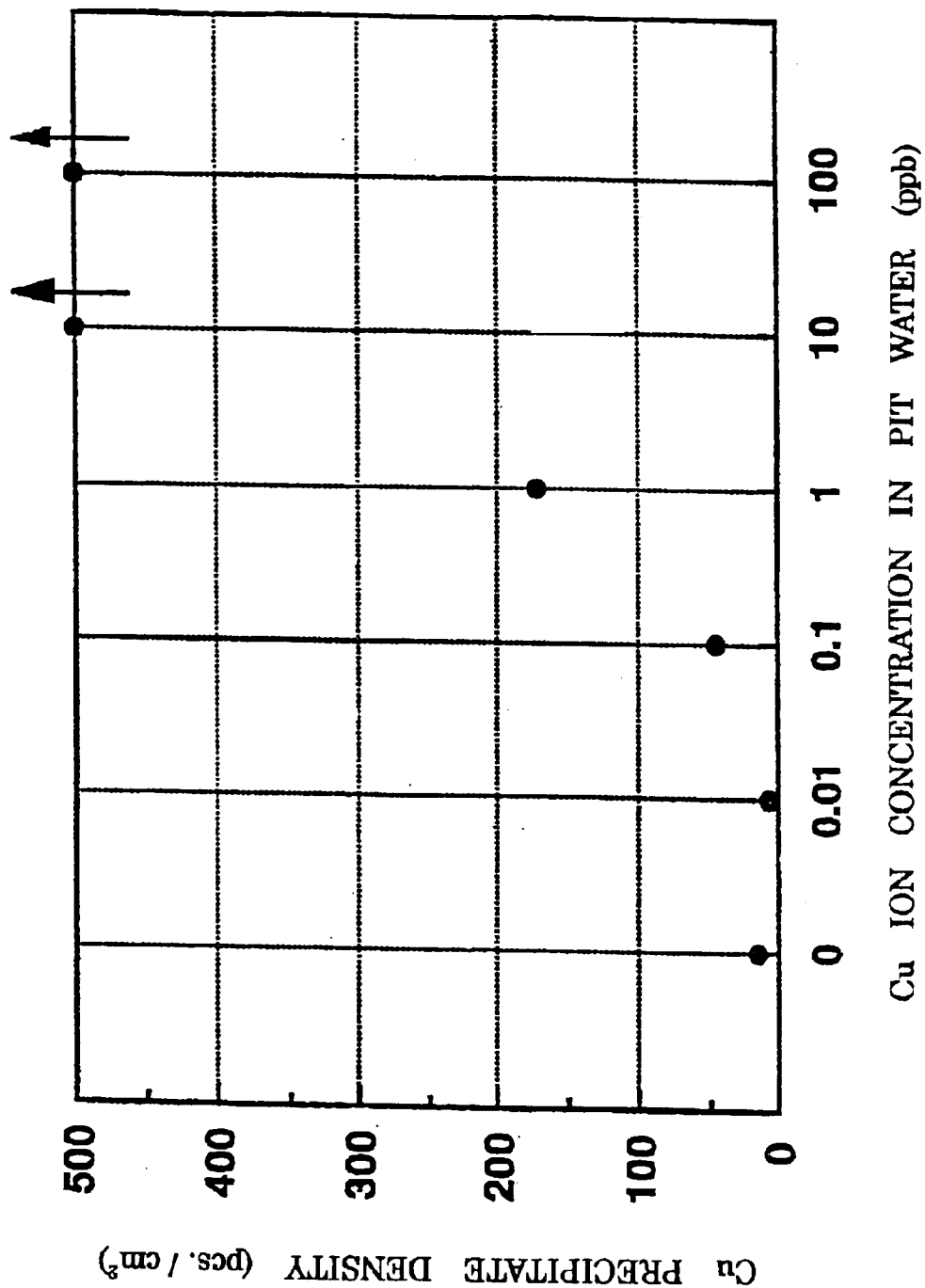
FIG. 1 is a graph showing a relationship between the concentration of Cu ions in pit water and the density of Cu precipitates after Cu decoration treatment.

Next, the present invention will be described in detail; however, the present invention is not limited thereto.

The present inventors analyzed the causes of generation of the above-mentioned degradation of oxide dielectric breakdown voltage, and found that such degradation is produced when a silicon wafer having a hydrophobic surface coexists with a metal having an ionization tendency lower than that of silicon. They also found that such a coexisting state is created when a wafer is temporarily stored in water immediately after being polished during a period between the polishing step and the cleaning step.

Especially, when the metal impurity is Cu, the above-mentioned problems becomes serious. The present inventors found that degradation of oxide dielectric breakdown voltage occurs even when the concentration of Cu in the storage solution is 1 ppb or less. This phenomenon is not limited to a wafer immediately after polishing; the degradation of oxide dielectric breakdown voltage may occur when a wafer is stored in water, and especially when the wafer has a hydrophobic surface. For example, a similar phenomenon was confirmed to occur in an epitaxial wafer having a hydrophobic surface.

In the above-mentioned storage methods, problems become serious especially when the concentration of Cu exceeds 0.01 ppb, resulting in degradation of the quality of the oxide film of a wafer. On the other hand, when the Cu concentration of the storage water is 0.01 ppb or less, such degradation is not observed.

Although the causes of degradation of the quality of an oxide film are not definitely identified, a conceivable cause is that when Cu, especially in the form of Cu ions, exists in the storage water, it electrochemically reacts with Si to precipitate, so that defects are generated on a silicon wafer.

This phenomenon occurred regardless of whether or not a surfactant is added to the storage water. However, the phenomenon was observed more frequently when a surfactant was added. Conceivably, the reason is that a surfactant in some way affects the process of precipitation of Cu, resulting in facilitated generation of defects which degrade the quality of oxide film.

Cu and the like precipitated on the surface of a silicon wafer can be removed in a subsequent cleaning step. However, defects generated on the surface of the silicon wafer due to the reaction remain, and conceivably cause degradation of the quality of oxide film.

In view of the foregoing, the present inventors conceived a method of storing a silicon wafer through use of water which contains Cu at a concentration of 0.01 ppb or less in order to prevent degradation of the quality of oxide film of the silicon wafer.

In this method, the concentration of Cu—which causes generation of defects on a silicon wafer—is regulated to 0.01 ppb or less so that Cu ions in the storage water are prevented from electrochemically reacting with Si, which would otherwise result in precipitation of Cu. As a result, there is prevented degradation of oxide dielectric breakdown voltage of a silicon wafer, which would otherwise occur due to defects such as damage on the surface of a silicon wafer produced due to the Cu contamination.

The storage water of the present invention is not limited to being used singly, and may be used in a mixture of the storage water and other solution or the like. For example, a surfactant may be mixed into the storage water of the present invention in order to improve the particle removal performance of the storage water. Examples of the surfactant include polyoxiethylene alkylphenyl ether. Further, the storage water of the present invention and an organic solution or the like may be mixed together in order to prepare a storage solution used for storing a silicon wafer.

In this case, the storage water is preferably used in the form of pit water so as to maintain the concentration of added surfactant at a certain level.

In the present specification, "pit water" refers to storage water stored in a storage container, bath, tank, or vessel used for storage of a silicon wafer in a state in which water is not introduced, drained, or circulated, so that the storage water is stagnant.

In place of the above-described surfactant, other solution such as an organic solution may be added to the storage water of the present invention in order to prepare a storage solution for storage of a silicon wafer. Such storage solution also provides an effect of preventing degradation of oxide dielectric breakdown voltage.

Also, the present inventors conceived another method of storing a silicon wafer in storage solution which is prepared through addition of a chelating agent to water or chemical solution in order to make the above-mentioned ions of metals such as Cu innocuous or harmless, to thereby prevent degradation of quality of oxide film of a silicon wafer.

In this method, since water or chemical solution containing a chelating agent is used as storage solution, even when ions of a metal such as Cu are introduced into the storage solution, the ions are changed into a chelate compound so that the ions are prevented from adhering to a silicon wafer. As a result, there is prevented degradation of oxide dielectric breakdown voltage of the silicon wafer which would otherwise occur due to metallic contamination of the storage solution.

In the present invention, the water to which a chelating agent is added is pure water, preferably ultrapure water. Also, examples of the chemical solution include but are not limited to an acidic solution, an alkaline solution, and an organic solution; more specifically, trichloroethylene and ethanol.

Also, the water to which a chelating agent is added may be the storage water of the present invention which contains Cu at a concentration of 0.01 ppb or less. In this case, the water provides more significant effects, since the Cu concentration of the water is low.

The amount of the added chelating agent depends on the degree to which the metal ion concentration in the storage solution increases. When the metal ion concentration within the storage solution is at a high level, degradation of oxide dielectric breakdown voltage can be prevented through an increase in the amount of the added chelating agent. For example, if the chelating agent is added to the storage solution such that the concentration of the chelating agent becomes 0.05 mol/L or higher, the effects of preventing degradation of oxide dielectric breakdown voltage become more remarkable.

In the case where the storage solution is water, a chelating agent is not dissolved well in the water, because of a low solubility of the chelating agent to water. Therefore, when the concentration of metal ions contained in the storage water is high, contamination by the metal ions cannot be suppressed sufficiently by the chelating agent at a concentration at which the chelating agent can be dissolved into the water. In such a case, an alkaline solution in which the chelating agent exhibits a higher solubility is preferably used as a storage solution, to which the chelating agent is added.

Examples of the alkaline solution include aqueous ammonia, sodium hydroxide, potassium hydroxide, and mixtures thereof. However, the alkaline solution is not particularly limited thereto so long as a selected alkaline solution can dissolve the chelating agent to a sufficient degree.

In the case where water or chemical solution, especially an alkaline solution, which contains a chelating agent is used as storage solution, the surface of a wafer may be roughened due to the etching action of the alkaline component. In this case, a proper amount of a surfactant is preferably added to the storage solution.

As mentioned above, addition of a surfactant to the storage solution prevents roughening of the surface of a wafer, which roughening would otherwise occur due to the etching effect of the alkaline component.

The mechanism is considered to be as follows: when a surfactant is added to the storage water, the particles of the surfactant physically adhere to a silicon wafer, so that the particles prevent reaction between the silicon wafer and the alkaline component contained in the storage water.

An example of the surfactant is polyoxiethylene nonylphenyl ether, which is a neutral surfactant. However, the same effects can be obtained through use of another neutral surfactant such as polyoxiethylene lauryl ether, or an anionic surfactant such as polyoxiethylene alkylphenyl sodium sulfate.

The amount of the added surfactant is determined on the basis of the amount of a chelating agent as well as the amount of an aqueous alkaline solution required for dissolution of the chelating agent, and is not particularly limited so long as the effects of the present invention are achieved.

The effects of the present invention are attained through use of any chelating agent so long as it can change metal ions contained in the storage water into a chelate compound. However, more significant effects can be obtained through use of a chelating agent having a chelate compound production performance higher than that of NTA. That is, in order to sufficiently form chelate and capture metals such as Cu having an ionization tendency lower than that of silicon, the chelating agent must have a chelate compound production performance higher than that of NTA.

Other examples of the chelating agent having a chelate compound production performance higher than that of NTA include EDTA, DTPA, CyDTA, and sodium salts thereof. Use of a sodium salt or the like allows a larger amount of the chelating agent to be brought into an aqueous state without use of an alkaline solution. These chelating agents provide desired effects whether they are used singly or as a mixture of two or more.

As aforementioned, the amount of the added chelating agent depends on the degree to which the metal ion concentration in the storage solution increases. A sufficient result is attained through use of the chelating agent at a concentration of $1 \times 10^{-5}$ mol/L when the amount of contaminants externally introduced from, for example, preceding steps, is small (about several ppb). However, when the concentration of the chelating agent is 0.05 mol/L or more, the effects of the present invention can be attained to a more significant degree even when metal ions exist at high concentration. In this case, if there is fear of surface roughening of a wafer, the amount of the added surfactant for prevention of surface roughening is advantageously increased.

The storage water and storage method of the present invention are effective regardless of whether the surface of a stored silicon wafer is hydrophilic or hydrophobic. However, a silicon wafer whose surface has no natural oxide film and is therefore hydrophobic is particularly advantageously stored through use of the storage water and storage method of the present invention, since the surface of the silicon wafer is active and susceptible to contamination.

Therefore, the present invention is highly suitable for storage of a silicon wafer in water immediately after polishing, which has no natural oxide film and therefore has a hydrophobic surface. For example, the storage water and storage method of the present invention are used in the case where a wafer is stored in water during the waiting period between the polishing step and the cleaning step in the process of fabricating a silicon wafer.

The present invention is also applicable to storage of a silicon wafer after etching or cleaning performed through use of hydrofluoric acid (HF). The present invention is effective in this application, because an oxide film is removed from the surface of a silicon wafer by hydrofluoric acid (HF), so that the surface of the silicon wafer becomes active and susceptible to contamination by Cu.

Therefore, the present invention can prevent adhesion of polishing slurry to a silicon wafer, which would otherwise occur when the wafer is left in the air during the waiting period between steps, while preventing degradation of oxide dielectric breakdown voltage, which would otherwise occur due to contamination from the storage water.

EXAMPLES

Next, the present invention will be described by way of examples; however, the examples should not be construed as limiting the present invention.

Example 1 and Comparative Example 1

There were prepared six pit containers each containing ultrapure water and polyoxiethylene alkylphenyl ether serving as a surfactant. Copper was then added to the storage water in each container in order to adjust the concentration of Cu ions in the storage water in each container to one of different values in the range of 0–100 ppb. The concentration of the surfactant was 10 vol % in each container.

Mirror-polished silicon wafers were prepared from a silicon monocrystalline ingot grown by the Czochralski method. The natural oxide film of each silicon wafer was removed by use of diluted hydrofluoric acid (DHF) so that the silicon wafer attained a hydrophobic surface. This treatment was performed so as to bring the surface of each silicon wafer into a state identical to that immediately after polishing. The each wafer was immersed in the above-mentioned pit water for 30 minutes, subjected to generally-practiced RCA cleaning and thermal oxidization, and the quality of oxide film of the wafer was evaluated.

RCA cleaning method, a standard method of cleaning a silicon wafer proposed by Kern, comprises three steps: removing an oxide film and surface layer of a silicon wafer by use of $NH_4OH/H_2O_2$; removing, by use of HF, an oxide film which has been formed on the silicon wafer in the preceding step; and removing heavy metals and forming a natural oxide film by use of $HCl/H_2O_2$.

The quality of an oxide film was evaluated in accordance with the Cu decoration method. The Cu decoration method is performed as follows. A potential is applied to a thermal oxide film in a solution containing $Cu^{2+}$ ions dissolved therein, so that a current flows through a degraded portion of the oxide film, and $Cu^{2+}$ ions precipitate in the form of Cu. As the density of precipitates is low, the quality of an oxide film is determined to be high (W. J. Shannon; A Study of Dielectric Defect Detection by decoration with Copper, RCA review. 30, 430, 1970).

In the experiment, a thermal oxide film having a thickness of 25 nm was formed, an electric field of 5 MV/cm was applied thereto for 15 minutes, and the density of Cu precipitates was measured under an optical microscope.

FIG. 1 shows a relationship between the concentration of Cu ions and the density of Cu precipitates after the Cu decoration treatment. As shown in FIG. 1, when the Cu ion concentration is 0.1 ppb or more, the amount of the precipitates drastically increases, and when the Cu ion concentration is 10 ppb or more, the amount of the precipitates exceeds 500 pcs/cm$^2$. It is understood from FIG. 1, when the Cu ion concentration is adjusted to 0.1 ppb or less, which is the range employed in the present invention, there is achieved the quality of an oxide film equivalent to that of a wafer immersed in pure water which is not intentionally contaminated.

Example 2 and Comparative Example 2

Four kinds of storage water were prepared through use of intentionally contaminated water containing Cu ions at a concentration of 1 ppb and through selective addition of NTA, EDTA, DTPA, or CyDTA at a concentration of 0.05 mol/L. For comparison, there were prepared pure water not intentionally contaminated with Cu, and storage water containing Cu at a concentration of 1 pbb but containing no chelating agent.

Subsequently, FZ silicon wafers were prepared in accordance with the floating zone (FZ) method. A natural oxide film present on the surface of each wafer was removed by use of hydrofluoric acid, as in the case of Example 1 and Comparative Example 1. The thus-treated FZ silicon wafers having no natural oxide film were immersed for 30 minutes in respective containers containing the above-mentioned different kinds of storage water. Next, the wafers were subjected to a known method of RCA cleaning, and the oxide dielectric breakdown voltage was evaluated. The oxide dielectric breakdown voltage was evaluated on the basis of C-mode yield, as determined based on the Time Zero Dielectric Breakdown (TZDB). Specifically, a phosphorus-doped poly silicon electrode (thickness of oxide film: 25 nm, area of electrodes: 8 mm$^2$) was formed, and a dielectric breakdown electrical field was determined at a current density in decision of 1 mA/cm$^2$. Wafers having a dielectric breakdown electrical field of 8 MV/cm or higher were judged to be good (nondefective). The ratio of good chips to the total number of chips on a wafer was obtained as the C-mode yield.

The results are shown in Table 1.

TABLE 1

| Copper contamination | Chelating agent | C-mode yield (%) |
| --- | --- | --- |
| Not contaminated | None | 100 |
| Contaminated | None | 8 |
| Contaminated | NTA | 100 |
| Contaminated | EDTA | 100 |
| Contaminated | DTPA | 100 |
| Contaminated | CyDTA | 100 |

As is apparent from Table 1 above, when a silicon wafer is stored in Cu-contaminated storage water containing no chelating agent, degradation of oxide dielectric breakdown voltage is significant. In contrast, when a silicon wafer is stored in Cu-contaminated storage water containing a chelating agent, there occurs no degradation of oxide dielectric breakdown voltage, as in the case where the wafer is stored in pure water. This effect is obtained regardless of the type of the chelating agent.

Example 3 and Comparative Example 3

Several types of storage water were prepared under the conditions shown in Table 2. In Example 3 and Comparative Example 3, aqueous ammonia was used as the storage solution in order to dissolve a large amount of a chelating agent. As in the case of Example 1 and Comparative Example 1, a natural oxide film was removed from each FZ silicon wafer by use of hydrofluoric acid, and the wafer was immersed for 30 minutes in the pit water contained in the respective container. Subsequently, each wafer was subjected to RCA cleaning, and the oxide dielectric breakdown voltage and micro-roughness were evaluated. The micro-roughness was evaluated by use of LS-6000 manufactured by Hitachi Electronic Engineering, Co., Ltd. at a detection voltage of 900 V in a haze mode. Higher value of micro-roughness shows a rougher surface.

The results are shown in Table 2.

TABLE 2

| Copper ion concentration (ppb) | EDTA concentration (mol/l) | Aqueous ammonia | Surfactant | C-mode yield (%) | Micro-roughness (Bit) |
| --- | --- | --- | --- | --- | --- |
| 0 | — | — | — | 100 | 56 |
| 1000 | 0.05 | Contained | Contained | 35 | 58 |
| 1000 | 0.5 | Contained | Contained | 100 | 53 |
| 1000 | 0.5 | Contained | Not contained | 100 | 136 |

As shown in Table 2 above, in the case of intentionally contaminated storage water containing Cu ions at a high concentration of 1000 ppb, if EDTA concentration is set to 0.05 mol/L, the effect of preventing degradation of oxide dielectric breakdown voltage is achieved; however, the effect is not sufficient, so that the degradation cannot be prevented completely. By contrast, when the EDTA concentration is set to 0.5 mol/L, degradation of oxide dielectric breakdown voltage can be completely prevented, and there is achieved the same quality of oxide film as that of a wafer immersed in pure water which is not intentionally contaminated.

That is, through addition of a chelating agent to storage water according to the concentration of metal ions within the storage solution, degradation of oxide dielectric breakdown voltage can be prevented, even when the concentration of the metal ions is high.

In Example 3 of the present invention, aqueous ammonia was used as storage solution in order to dissolve a large amount of EDTA. Therefore, when no surfactant is added, the surface of a silicon wafer is roughened although degradation of oxide dielectric breakdown voltage can be prevented. When a surfactant is added, surface roughening is prevented, and the surface of a wafer can be maintained as in the case of storage in pure water, although the wafer is stored in a alkaline solution.

Example 4 and Comparative Example 4

Four types of storage water were prepared under the conditions shown in Table 3. As in the case of Example 1 and Comparative Example 1, a natural oxide film was removed from each FZ silicon wafer by use of hydrofluoric acid, and the wafer was immersed for 12 hours in the pit water contained in each container. Subsequently, the wafer was subjected to RCA cleaning, and the oxide dielectric breakdown voltage was evaluated. In Example 4 and Comparative Example 4, in order to evaluate subtle differences which cannot be detected on the basis of C-mode yield as determined from TZDB, the evaluation was performed not on the basis of C-mode yield, but on the basis of γ-mode yield, as determined from TDDB (Time Dependent Dielectric Breakdown). Specifically, a phosphorus-doped poly silicon electrode (thickness of oxide film: 25 nm, area of electrodes: 8 mm$^2$) similar to that formed in Example 2 and Comparative Example 2 was formed, and a stress current of 1 mA/cm$^2$ was continuously applied to the electrode. Wafers that did not cause dielectric breakdown at a charge density of 25 C/cm$^2$ were determined to be good (nondefective). The ratio of good chips to total number of chips was obtained as the γ-mode yield.

The results are shown in Table 3.

TABLE 3

| Copper ion concentration (ppb) | EDTA concentration (mol/l) | Surfactant (vol %) | γ-mode yield (%) |
|---|---|---|---|
| Not stored in water | — | — | 95 |
| 1 | $1 \times 10^{-5}$ | 0.1 | 93 |
| 1 | $1 \times 10^{-4}$ | 0.1 | 50 |
| 1 | $1 \times 10^{-4}$ | 1.0 | 92 |

As shown in Table 3, when the intentionally contaminated storage water contains Cu ions at a concentration of as low as 1 ppb, degradation of oxide dielectric breakdown voltage can be prevented to a sufficient degree through addition of EDTA in an amount as a small as about $1 \times 10^{-5}$ mol/L. In this case, if the EDTA concentration is increased to $1 \times 10^{-4}$ mol/L, oxide dielectric breakdown voltage is slightly decreased. This degradation is considered to be caused by the effects of surface roughening of a wafer due to the increase in the amount of EDTA. However, even in such a case, through an increase in the amount of the added surfactant, there is prevented surface roughening and degradation of oxide dielectric breakdown voltage.

The above-mentioned examples uses silicon wafers from which a natural oxide film is removed by use of hydrofluoric acid. The same results as described above were obtained for silicon wafers having no oxide film, such as a silicon wafer immediately after being subjected to polishing.

Further, in the above-described embodiment, storage water or solution is intentionally contaminated through use of Cu ions. However, the same test results were obtained for the case where storage water or solution was intentionally contaminated through use of other metal ions such as silver ions.

The present invention is not limited to the above-described embodiments. The above-described embodiments are mere examples, and those having the substantially same structure as that described in the appended claims and providing the similar action and effects are included in the scope of the present invention.

For example, the present invention is not limited to the case where a silicon wafer is temporarily stored during a period between steps in a silicon wafer production process; the present invention can be applied to any case where a silicon wafer is stored in water, and the above-described effects are attained in such a case.

The concentration of Cu contained in storage water greatly affects the oxide dielectric breakdown voltage of a silicon wafer when Cu is contained therein in the form of Cu ions. The same effect of Cu occurs even when the storage water contains Cu in different forms, such as in a form of elemental Cu and in a complex form, which are converted into ions in the storage water. Therefore, the present invention encompasses these cases.

What is claimed is:

1. A method for preventing particle adhesion, metal ion contamination, and the degradation of oxide dielectric breakdown voltage of a silicon wafer during a waiting period between a designated processing step and a cleaning step or between processing steps before a cleaning step comprising:

storing the silicon wafer during said waiting period in ultrapure water containing a cleaning agent and a surfactant, wherein the concentration of the Cu in the ultrapure water is regulated to 0.01 ppb or less.

2. A method for preventing particle adhesion, metal ion contamination, and the degradation of oxide dielectric breakdown voltage of a silicon wafer according to claim 1, wherein the silicon wafer to be stored has a hydrophobic surface.

3. A method for preventing particle adhesion, metal ion contamination, and the degradation of oxide dielectric breakdown voltage of a silicon wafer according to claim 1, wherein the designated processing step is a polishing step.

4. A method for preventing particle adhesion, metal ion contamination, and the degradation of oxide dielectric breakdown voltage of a silicon wafer according to claim 2, wherein the designated processing step is a polishing step.

5. A method for preventing particle adhesion, metal ion contamination, and the degradation of oxide dielectric breakdown voltage of a silicon wafer according to claim 1, wherein the chelating agent has a chelate compound production performance not lower than that of NTA.

6. A method for preventing particle adhesion, metal ion contamination, and the degradation of oxide dielectric breakdown voltage of a silicon wafer according to claim 1, wherein the chelating agent is selected from the group consisting of NTA, EDTA, DTPA, CyDTA, salts thereof, and a mixture thereof.

* * * * *